United States Patent
Koshimizu et al.

(10) Patent No.: US 10,211,031 B2
(45) Date of Patent: Feb. 19, 2019

(54) PLASMA PROCESSING APPARATUS AND PLASMA PROCESSING METHOD

(71) Applicant: TOKYO ELECTRON LIMITED, Tokyo (JP)

(72) Inventors: Chishio Koshimizu, Yamanashi (JP); Jun Yamawaku, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 679 days.

(21) Appl. No.: 14/576,424

(22) Filed: Dec. 19, 2014

(65) Prior Publication Data
US 2015/0179407 A1 Jun. 25, 2015

(30) Foreign Application Priority Data
Dec. 20, 2013 (JP) .................. 2013-263996

(51) Int. Cl.
*H01J 37/32* (2006.01)

(52) U.S. Cl.
CPC .. *H01J 37/32183* (2013.01); *H01J 37/32091* (2013.01)

(58) Field of Classification Search
CPC .............. H01J 37/32183; H01J 37/32091
See application file for complete search history.

(56) References Cited

U.S. PATENT DOCUMENTS

2008/0128087 A1* 6/2008 Hayano ............ H01J 37/32091
156/345.28
2008/0284537 A1* 11/2008 Ikenouchi ................ H03H 7/40
333/17.3

FOREIGN PATENT DOCUMENTS

JP          10-64696 A      3/1998
JP        2006-139949 A     6/2006

* cited by examiner

*Primary Examiner* — David P Turocy
(74) *Attorney, Agent, or Firm* — Rothwell, Figg, Ernst & Manbeck, P.C.

(57) ABSTRACT

Disclosed is a plasma processing method for generating plasma between an upper electrode connected with a VF power supply and a susceptor disposed to face the upper electrode to perform a plasma processing on a wafer by the plasma. The plasma processing method includes: providing an auxiliary circuit configured to reduce a difference between a reflection minimum frequency of a first route where a high frequency current generated from the VF power supply flows before ignition of the plasma and a reflection minimum frequency of a second route where the high frequency current generated from the VF power supply flows after the ignition of the plasma; igniting the plasma; and maintaining the plasma.

9 Claims, 11 Drawing Sheets

PLASMA PROCESSING APPARATUS AND PLASMA PROCESSING METHOD

CROSS-REFERENCE TO RELATED APPLICATIONS

This application is based on and claims priority from Japanese Patent Application No. 2013-263996, filed on Dec. 20, 2013, with the Japan Patent Office, the disclosure of which is incorporated herein in its entirety by reference.

TECHNICAL FIELD

The present disclosure relates to a plasma processing method and a plasma processing apparatus which use capacitively coupled plasma.

BACKGROUND

In a plasma processing apparatus using capacitively coupled plasma such as, for example, a parallel plate type plasma processing apparatus, a processing gas is introduced between an upper electrode and a lower electrode within a processing chamber, and the introduced processing gas is excited by an electric field so that plasma is generated (plasma is ignited).

When igniting the plasma, it is necessary to increase a voltage across an electrode (the upper electrode or the lower electrode) connected to a high frequency power supply so as to generate an electric field between the upper electrode and the lower electrode. Before the ignition of the plasma, however, since the plasma serving as a conductor does not exist between the upper electrode and the lower electrode, a high frequency current generated from the high frequency power supply 110 does not flow between the upper electrode 111 and a susceptor 112 serving as the lower electrode. Rather, the high frequency current flows from the upper electrode 111 connected to the high frequency power supply 110 to a ground via an insulation member (e.g., an insulator) of a chamber 113. In connection with this, please refer to, for example, FIG. 11.

Meanwhile, after the ignition of the plasma, the high frequency current generated from the high frequency power supply 110 flows to the ground through the space between the upper electrode 111 and the susceptor 112 since the plasma P exists between the upper electrode 111 and the susceptor 112.

That is, a first route $L_1$ of a high frequency current (indicated by a solid line arrow in FIG. 11) before the ignition of the plasma P and a second route $L_2$ of a high frequency current (indicated by a broken line arrow in FIG. 11) after the ignition of the plasma P are different from each other. Further, a first path capacity such as, for example, an insulator, exists in the route $L_1$ while a path capacity of a sheath $S_1$, a path capacity of the plasma P, a path capacity of a sheath $S_2$, and a path capacity between a wafer W and the susceptor 112 exist in the second route $L_2$. Thus, the path capacity of the first route $L_1$ and the path capacity of the second route $L_2$ are different from each other. As a result, a load impedance from the high frequency power supply 110 to the ground is greatly changed before and after the ignition of the plasma P.

When the path capacity in a route is changed, a resonance frequency in the route is changed, and further a reflection minimum frequency close to the resonance frequency is also changed. Therefore, in a case where the high frequency power supply 110 is generating a high frequency current having a reflection minimum frequency of the first route $L_1$ before the ignition of the plasma P, when the plasma P is ignited and the route of the high frequency current is changed from the first route $L_1$ to the second route $L_2$, the frequency of the high frequency current is different from the reflection minimum frequency of the second route $L_2$ and thus, most of the high frequency current is reflected to the high frequency power supply 110. As a result, the high frequency current hardly flows in the second route $L_2$ and the electric field between the upper electrode 111 and the susceptor 112 may not be maintained so that the plasma P may not be maintained.

In connection with this, it has been proposed to change the frequency of the high frequency current generated from the high frequency power supply before and after the ignition of the plasma. In particular, since changing a capacity of a variable capacitor 115 of a matching circuit (matcher) 114 disposed between the high frequency power supply 110 and the upper electrode 111 is equivalent to changing the frequency of the high frequency current generated from the high frequency power supply 110, it has been proposed to change the capacity of the variable capacitor 115 of the matcher before and after the ignition of the plasma.

However, the change of the capacity of the variable capacitor 115 involves a mechanical operation in the variable capacitor 115 and thus requires a certain length of time. Therefore, the change of the capacity is not able to temporally follow the change from the reflection minimum frequency of the first route $L_1$ to the reflection minimum frequency of the second route $L_2$ before and after the ignition of the plasma. As a result, in some cases, a period where the high frequency current hardly flows in the second route $L_2$ occurs so that the plasma P may not be maintained.

Thus, for example, Japanese Patent Laid-Open Publication No. H10-64696 proposes a technology of electronically changing the frequency of the high frequency current generated from the high frequency power supply 110, for example, a technology for controlling the frequency of the high frequency current by a controller installed separately from the high frequency power supply to increase the frequency of the high frequency current when the plasma is ignited. When electronically changing the frequency of the high frequency current, the frequency may be quickly changed. Thus, the frequency of the high frequency current may temporally follow the change from the reflection minimum frequency of the first route $L_1$ to the reflection minimum frequency of the second route $L_2$.

SUMMARY

The present disclosure provides a plasma processing method for generating plasma between a first electrode connected with a high frequency power supply and a second electrode disposed to face the first electrode and performs a plasma processing on a substrate by the plasma. The plasma processing method includes: providing an auxiliary circuit configured to adjust a difference between a load impedance from the high frequency power supply to a ground before ignition of the plasma and a load impedance from the high frequency power supply to the ground after the ignition of the plasma; igniting the plasma; and maintaining the plasma.

The foregoing summary is illustrative only and is not intended to be in any way limiting. In addition to the illustrative aspects, embodiments, and features described above, further aspects, embodiments, and features will

BRIEF DESCRIPTION OF THE DRAWINGS

FIGS. 4A to 4C are views for describing a frequency of a high frequency current generated from a VF power supply in the plasma processing method according to the present exemplary embodiment, in which FIG. 4A illustrates a case where only the frequency of a high frequency current is changed before and after ignition of plasma, FIG. 4B illustrates a case where the frequency of a high frequency current is not changed before and after ignition of plasma, and FIG. 4C illustrates a case where the frequency of a high frequency current is changed and a reflection characteristic of a second route is changed as well before and after ignition of plasma.

FIGS. 10A to 10C are views for describing an influence of a capacity of an auxiliary circuit on a reflection characteristic of a route of a high frequency current, in which FIG. 10A is a wiring diagram schematically illustrating a circuit of a plasma processing apparatus used by the inventors in a test for confirming the influence, FIG. 10B is a graph representing a reflection characteristic when the internal pressure of the processing space is 800 mTorr and the processing gas is formed of a mixed gas of argon gas and oxygen gas, and FIG. 10C is a graph representing a reflection characteristic when the internal pressure of the processing space is 800 mTorr and the processing gas is formed of a single gas of nitrogen gas.

DETAILED DESCRIPTION

Figure 1:
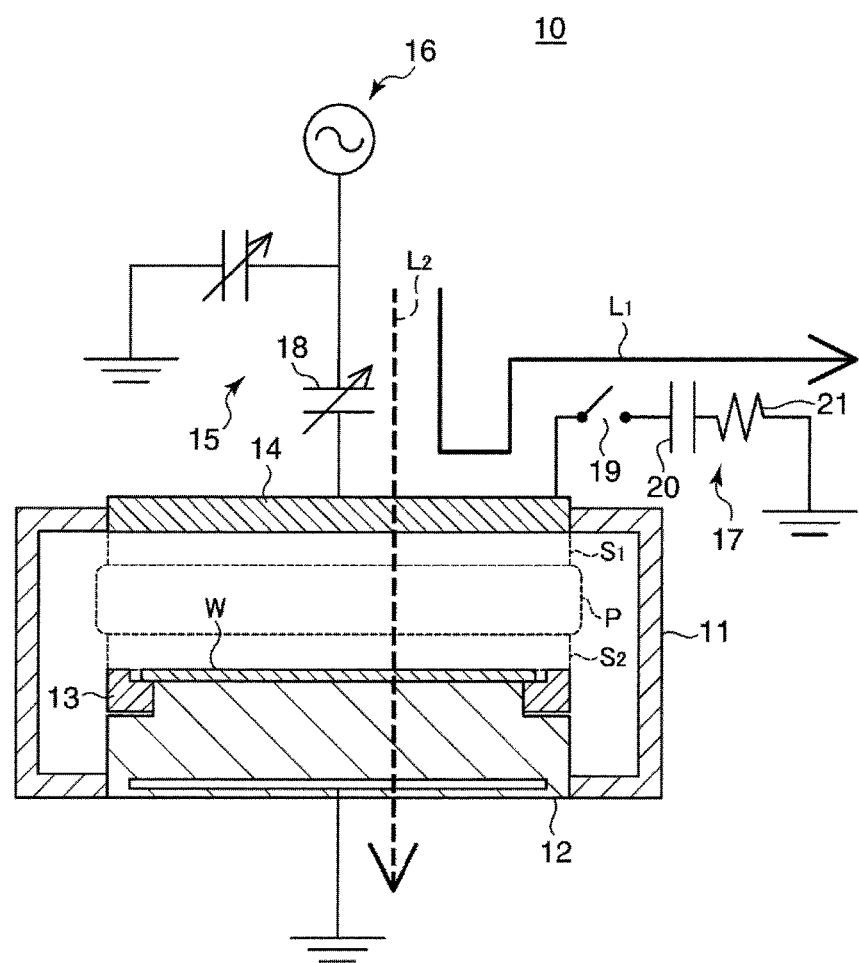
FIG. 1 is a cross-sectional view schematically illustrating a configuration of a plasma processing apparatus according to a first exemplary embodiment of the present disclosure.

In the following detailed description, reference is made to the accompanying drawing, which form a part hereof. The exemplary embodiments described in the detailed description, drawing, and claims are not meant to be limiting. Other exemplary embodiments may be utilized, and other changes may be made without departing from the spirit or scope of the subject matter presented here.

In the foregoing prior art, the difference between the path capacity of the first route $L_1$ and the path capacity of the second route $L_2$ is large, and a change width from the reflection minimum frequency of the first route $L_1$ to the reflection minimum frequency of the second route $L_2$ before and after the ignition of plasma is large. However, it is difficult to increase the change width of frequency so large in the case where the frequency of the high frequency current is electronically changed. Thus, it is difficult to change the frequency of the high frequency current to the reflection minimum frequency of the second route $L_2$. Consequently, in some cases, the high frequency current hardly flows in the second route $L_2$ so that the plasma may not be maintained.

An object of the present disclosure is to provide a plasma processing method and a plasma processing apparatus which are capable of reliably maintaining plasma.

In order to achieve the object described above, the present disclosure provides a plasma processing method for generating plasma between a first electrode connected with a high frequency power supply and a second electrode disposed to face the first electrode and performs a plasma processing on a substrate by the plasma. The plasma processing method includes: providing an auxiliary circuit configured to adjust a difference between a load impedance from the high frequency power supply to a ground before ignition of the plasma and a load impedance from the high frequency power supply to the ground after the ignition of the plasma; igniting the plasma; and maintaining the plasma.

The auxiliary circuit adjusts a difference between a reflection minimum frequency of a first route where a high frequency current generated from the high frequency power supply flows before the ignition of the plasma and a reflection minimum frequency of a second route where the high frequency current generated from the high frequency power supply flows after the ignition of the plasma.

The high frequency power supply is a frequency-variable power supply and a frequency range to be changed by the frequency-variable power supply includes the reflection minimum frequency of the first route and the reflection minimum frequency of the second route.

The difference between the reflection minimum frequency of the first route and the reflection minimum frequency of the second route is within 2 MHz.

After the ignition of the plasma, the auxiliary circuit is separated from the first route.

After the ignition of the plasma, a capacity of the auxiliary circuit is adjusted.

A matching circuit configured to change a capacity is disposed between the high frequency power supply and the first electrode, and the matching circuit adjusts the difference between the reflection minimum frequency of the first route and the reflection minimum frequency of the second route.

The auxiliary circuit may adjust a capacity thereof to reduce the difference between the load impedance from the high frequency power supply to the ground before ignition of the plasma and the load impedance from the high frequency power supply to the ground after the ignition of the plasma.

In order to achieve the object described above, the present disclosure provides a plasma processing apparatus that generates plasma between a first electrode connected with a high frequency power supply and a second electrode disposed to face the first electrode to perform a plasma processing on a substrate. The plasma processing apparatus is provided with an auxiliary circuit configured to adjust a difference between a load impedance from the high frequency power supply to a ground before ignition of the plasma and a load impedance from the high frequency power supply to the ground after the ignition of the plasma.

The auxiliary circuit adjusts a difference between a reflection minimum frequency of a first route where a high frequency current generated from the high frequency power supply flows before the ignition of the plasma and a reflection minimum frequency of a second route where the high frequency current generated from the high frequency power supply flows after the ignition of the plasma.

The auxiliary circuit may be connected to the first electrode.

The auxiliary circuit may be connected to the second electrode.

The plasma processing apparatus further includes: a processing chamber configured to accommodate the substrate therein. The first electrode and the second electrode face each other within the processing chamber, and the auxiliary circuit is connected to a third electrode other than the first electrode and the second electrode. The third electrode being disposed on a wall of the processing chamber to face the plasma.

The auxiliary circuit may adjust a capacity thereof to reduce the difference between the load impedance from the high frequency power supply to the ground before ignition of the plasma and the load impedance from the high frequency power supply to the ground after the ignition of the plasma.

According to the present disclosure, the load impedance from the high frequency power supply to the ground before the ignition of the plasma and the load impedance from the high frequency power supply to the ground after the ignition of the plasma is reduced by the auxiliary circuit, the difference between the reflection minimum frequency of the first route where the high frequency current generated from the high frequency power supply flows before the ignition of the plasma and the reflection minimum frequency of the second route where the high frequency current generated from the high frequency power supply flows after the ignition of the plasma may be reduced. As a result, when the frequency of the high frequency current is electronically changed by the high frequency power supply, the high frequency power supply is capable of generating any of the high frequency current having the reflection minimum frequency of the first route and the high frequency current having the reflection minimum frequency of the second route. Consequently, the plasma may be reliably ignited and reliably maintained.

Hereinafter, exemplary embodiments of the present disclosure will be described with reference to accompanying drawings.

First, descriptions will be made on a plasma processing apparatus according to a first exemplary embodiment of the present disclosure.

FIG. 1 is a cross-sectional view schematically illustrating a configuration of the plasma processing apparatus according to the first exemplary embodiment of the present disclosure.

Referring to FIG. 1, a plasma processing apparatus 10 is a parallel plate type capacitively coupled plasma processing apparatus. The plasma processing apparatus 10 includes: a substantially cylindrical chamber 11 (a processing chamber) inside of which may be decompressed; a pedestal-like susceptor 12 (a second electrode) mounted on a bottom within the chamber 11 to mount a semiconductor wafer W (hereinafter, simply referred to as a "wafer W") thereon; an annular focus ring 13 disposed to surround the wafer W mounted on the susceptor 12; an upper electrode 14 (a first electrode) mounted on a ceiling portion of the chamber 11 to face the susceptor 12; a frequency-variable power supply (hereinafter, referred to as a "VF power supply") 16 connected to the upper electrode 14 via a matcher (matching circuit) 15; and an auxiliary circuit 17 connected to the upper electrode 14 to ground the upper electrode.

In the plasma processing apparatus 10, a processing gas is introduced into the decompressed chamber 11 and a high frequency power is supplied to the inside of the chamber 11 from the VF power supply 16 so that an electric field generated by the supplied high frequency power ignites and generates plasma P, and a desired plasma processing such as, for example, a dry etching processing or a film-forming processing, is performed on the wafer W by the plasma P.

Since the electric field is generated between the upper electrode 14 and the susceptor 12 serving as the lower electrode, the plasma P is also generated between the upper electrode 14 and the susceptor 12. At this time, a sheath $S_1$ is interposed between the upper electrode 14 and the plasma P, and a sheath $S_2$ is interposed between the plasma P and the susceptor 12.

The VF power supply 16 is capable of electronically changing the frequency of the supplied high frequency power in a predetermined range, for example, in a range of ±1 MHz, and the matcher 15 changes the capacity of a variable capacitor 18 to minimize the reflection of the high frequency current generated from the VF power supply 16 in the upper electrode 14 with the variable capacitor 18. In addition, the chamber 11 includes an insulation member such as, for example, an insulator (not illustrated) to be grounded, and the auxiliary circuit 17 includes a switch 19 configured to cut off a wiring, a capacitor 20, and a resistor 21.

In the plasma processing apparatus 10, before the ignition of the plasma P (generation of the plasma P), the plasma P serving as a conductor does not exist in a space (hereinafter, referred to as a "processing space") between the upper electrode 14 and the susceptor 12, and the electrostatic capacity of the processing space is very small. Thus, the high frequency current generated from the VF power supply 16 does not flow to the processing space, but flows from the upper electrode 14 to a ground via the auxiliary circuit 17.

Meanwhile, after the ignition of the plasma P, since the plasma P exists in the processing space, the susceptor 12 having a large electrostatic capacity is electrically connected to the VF power supply 16 via the upper electrode 14, and the high frequency current generated from the VF power supply 16 flows to the processing space and flows to the ground via the susceptor 12.

That is, in the plasma processing apparatus 10, the first route $L_1$ of the high frequency current before the ignition of the plasma P (an arrow indicated by a solid line in FIG. 1) and the second route $L_2$ of the high frequency current after the ignition of the plasma P (an arrow indicated by a broken line in FIG. 1) are different from each other. In the first route $L_1$, for example, a path capacity of the matcher 15 and a path capacity of the auxiliary circuit 17 exist, and in the second route $L_2$, for example, a path capacity of the sheath $S_1$, a path capacity of the plasma P, a path capacity of the sheath $S_2$, and a path capacity between the wafer W and the susceptor 12 exist. Thus, the first route $L_1$ and the second route $L_2$ have different specific path capacities, respectively. Since a resonance frequency of a route of a high frequency current is determined by the specific path capacity of the route, the resonance frequency of the first route $L_1$ and the resonance frequency of the second route $L_2$ are also different from each other.

In general, close to a resonance frequency of a route of a high frequency current, specifically, between a parallel resonance frequency and a serial resonance frequency, a reflection minimum frequency, where the reflectivity of the high frequency current is the lowest in the route, exists. When a high frequency current having the reflection minimum frequency flows in the route, a large amount of the high frequency current may efficiently flow in the route. Thus, for example, before the ignition of the plasma P, when a high frequency current having a reflection minimum frequency $F_1$ of the first route $L_1$ (hereinafter, simply referred to as a "reflection minimum frequency $F_1$") is generated from the VF power supply 16 so that a large amount of high frequency current may flow in the first route $L_1$, the voltage across the upper electrode 14 may increase so that an electric field may be generated in the processing space. Meanwhile, after the ignition of the plasma P, when a high frequency current having a reflection minimum frequency $F_2$ of the second route $L_2$ (hereinafter, simply referred to as a "reflection minimum frequency $F_2$") is generated from the VF power supply 16, a large amount of high frequency current may flow in the processing space so that an electric field may be maintained in the processing space.

Figure 2:
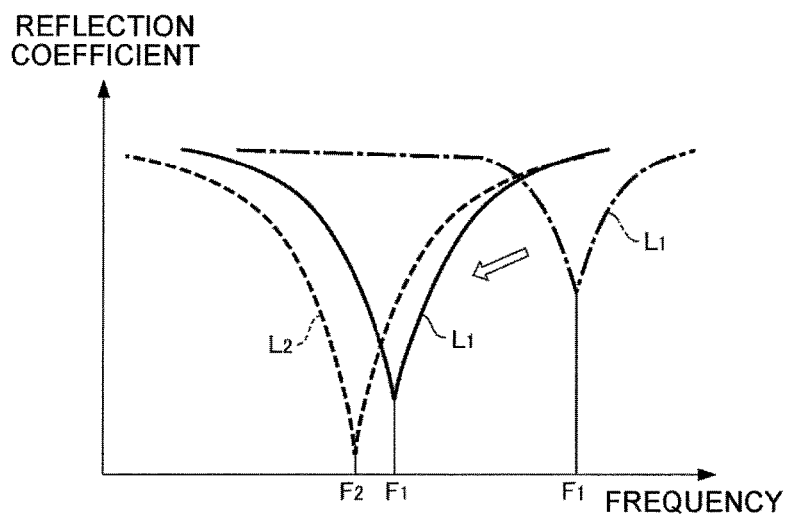
FIG. 2 is a view for describing a reflection characteristic of a high frequency current before and after ignition of plasma in the plasma processing apparatus of FIG. 1.

Here, assuming that no auxiliary circuit 17 exists in the plasma processing apparatus 10, since only the path capacity of the matcher 15 and the path capacity of, for example, the insulator of the chamber 11, mainly exist in the first route $L_1$, the specific path capacity of the first route $L_1$ becomes very small. Thus, the difference between the specific path capacity of the first route $L_1$ and the specific path capacity of the second route $L_2$, in which the susceptor 12 having a large electrostatic capacity exists, is increased. As a result, as illustrated in FIG. 2, the difference between a reflection characteristic of the first route $L_1$ (one-dot chain line) and a reflection characteristic of the second route $L_2$ (broken line) is increased and the difference between the reflection minimum frequency $F_1$ and the reflection minimum frequency $F_2$ is also increased.

In a case where the difference between the reflection minimum frequency $F_1$ and the reflection minimum frequency $F_2$ is large, for example, when the high frequency current having the reflection minimum frequency $F_1$ is being generated from the VF power supply 16, the reflection minimum frequency $F_2$ may be out of a frequency-variable range so that the frequency of the high frequency current may not be changed to the reflection minimum frequency $F_2$, even if the frequency of the high frequency current is changed to the reflection minimum frequency $F_2$ to maintain the electric field of the processing space after the ignition of the plasma.

In order to handle this, the present exemplary embodiment adjusts the specific path capacity of the first route $L_1$ before the ignition of the plasma P so as to reduce the difference between the reflection minimum frequency $F_1$ and the reflection minimum frequency $F_2$. Specifically, the path capacity of the auxiliary circuit 17 is adjusted to increase the specific path capacity of the first route $L_1$, and reduce the difference between a load impedance of the first route $L_1$ (the load impedance from the high frequency power supply to the ground before the ignition of the plasma) and a load impedance of the second route $L_2$ (the load impedance from the high frequency power supply to the ground after the ignition of the plasma). The reflection characteristic of the first route $L_1$ (a one-dot chain line and a solid line) may be brought close to the reflection characteristic of the second route $L_2$ (a broken line) (see a white arrow in the drawing) as illustrated in FIG. 2, for example, by either selecting the capacitor 20 having a proper capacity or adjusting a resistance value of the resistor 21.

As a result, the reflection minimum frequency $F_1$ and the reflection minimum frequency $F_2$ are brought close to each other so that the VF power supply 16 may generate either a high frequency current having the reflection minimum frequency $F_1$ or a high frequency current having the reflection minimum frequency $F_2$. Thus, the plasma P may be reliably ignited and reliably maintained. In particular, in the plasma processing apparatus 10 described above, it is preferable that the reflection minimum frequency $F_1$ and the reflection minimum frequency $F_2$ are included in the frequency-variable range of the VF power supply 16. Specifically, it is preferable that the difference between the reflection minimum frequency $F_1$ and the reflection minimum frequency $F_2$ is within 2 MHz.

In addition, since the VF power supply 16 does not change the frequency of the high frequency current which is generated by mechanically switching a circuit therein, the VF power supply 16 is hardly failed and as a result, the reliability of the plasma processing apparatus 10 may be enhanced.

Next, a plasma processing method according to the present exemplary embodiment will be described.

Figure 3:
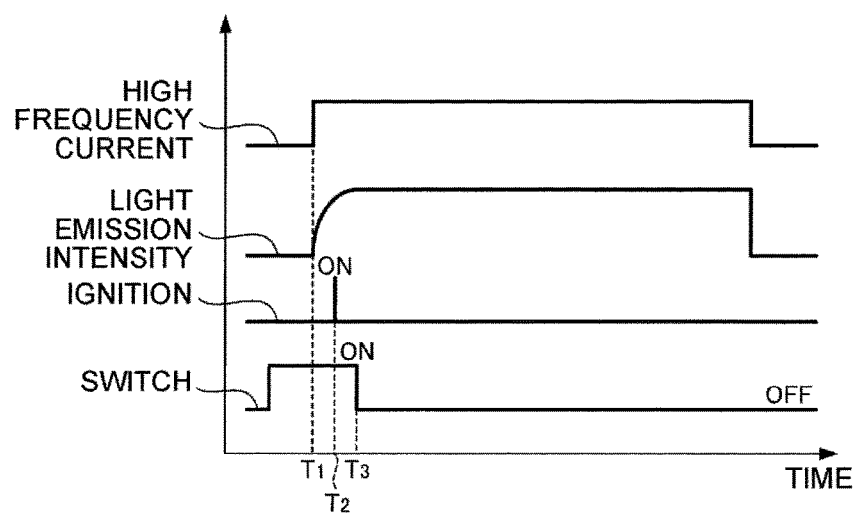
FIG. 3 is a view for describing a plasma processing method according to the present exemplary embodiment.

FIG. 3 is a view for describing the plasma processing method according to the present exemplary embodiment.

Referring to FIG. 3, first, before the ignition of plasma P, the switch 19 of the auxiliary circuit 17 is closed (turned ON) to cause the first route $L_1$ to pass through the auxiliary circuit 17 (a first step). At this time, the reflection characteristic of the first route $L_1$ is brought close to the reflection characteristic of the second route $L_2$ as illustrated in FIG. 2 by either selecting the capacitor 20 having a proper capacity or adjusting the resistance value of the resistor 21.

Next, the VF power supply 16 is caused to generate the high frequency current having the reflection minimum frequency $F_1$ and a processing gas is introduced into the processing space ("$T_1$" in the graph). Here, since the reflection minimum frequency of the first route $L_1$ is the reflection minimum frequency $F_1$, a large amount of high frequency current flows in the first route $L_1$ and the voltage across the upper electrode 14 is increased, thereby generating an electric field in the processing space.

Consequently, when the electric field is sufficiently developed, the processing gas is excited and the plasma P is ignited so that a light emission intensity of the plasma P increases in the processing space ("$T_2$" in the graph) (a second step).

Figure 4A:
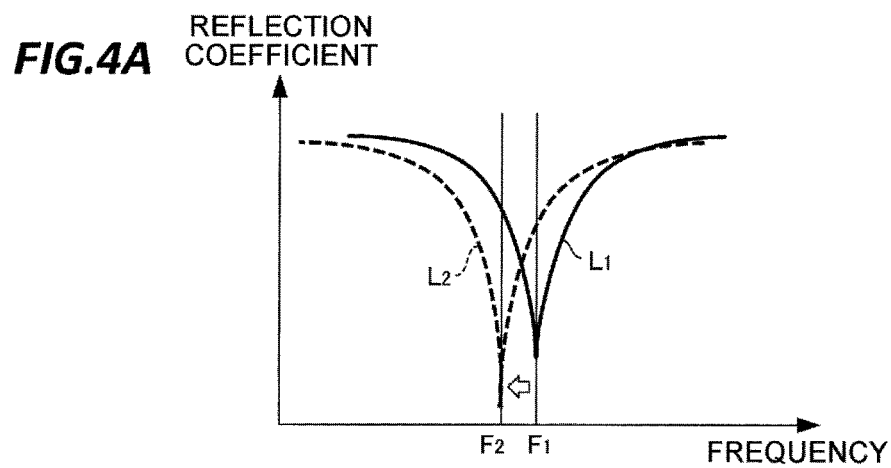

After the ignition of the plasma is confirmed by monitoring, for example, the light emission intensity of the plasma P, the voltage across the upper electrode 14, or the reflection of the high frequency current from the upper electrode 14, and detecting change points thereof, the switch 19 is opened (turned OFF) ("$T_3$" in the graph) to change the frequency of the high frequency current generated from the VF power supply 16 from the reflection minimum frequency $F_1$ to the reflection minimum frequency $F_2$ (FIG. 4A). At this time, since the specific path capacity of the first route $L_1$ decreases and the reflection minimum frequency $F_1$ increases to be greatly spaced away from the reflection minimum frequency $F_2$, the high frequency current hardly flows in the first route $L_1$ but efficiently flows in the second route $L_2$ so that the plasma P is maintained in the processing space (a third step).

According to the plasma processing method described above, the frequency of the high frequency current before the ignition of the plasma P is set to the reflection minimum frequency $F_1$. Thus, the voltage across the upper electrode 14 may be greatly increased by causing a large amount of high frequency current to flow in the first route $L_1$. Consequently, the plasma P may be reliably ignited and the ignition speed of the plasma P may be enhanced. Further, flame-out of the plasma P may be suppressed. Thus, the failure of the VF power supply 16 or the matcher 15 due to the impact of flame-out of the plasma P may be suppressed in advance.

In addition, according to the plasma processing method described above, the frequency of the high frequency current after the ignition of the plasma P is set to the reflection minimum frequency $F_2$. Thus, after the ignition of the plasma P, a large amount of high frequency current flows in the second route $L_2$ so that the electric field of the processing space may be maintained, and as a result, the plasma P may be reliably maintained.

Figure 4B:
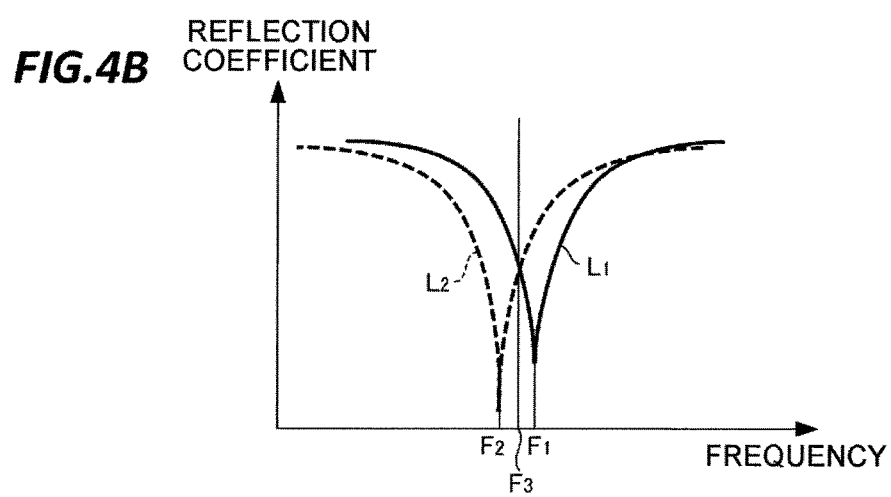

In the plasma processing method described above, the frequency of the high frequency current generated from the VF power supply 16 is changed before and after the ignition of the plasma P. However, the frequency of the high frequency current may not be changed before and after the ignition of the plasma P. In such a case, the frequency of the high frequency current is set to, for example, a frequency $F_3$ between the reflection minimum frequency $F_1$ and the reflection minimum frequency $F_2$, as illustrated in FIG. 4B. At the frequency $F_3$, either a reflection coefficient in the reflection characteristic of the first route $L_1$ or a reflection coefficient in the reflection characteristic of the second route $L_2$ is kept at a value reduced to some extent. Thus, before the ignition of the plasma P, a certain amount of high frequency current flows in the first route $L_1$, and after the ignition of the plasma, a certain amount of high frequency current also flows in the second route $L_2$. Thus, even if the frequency of the high frequency current is not changed, both the ignition of the plasma P and the maintenance of the plasma P may be achieved.

Figure 4C:
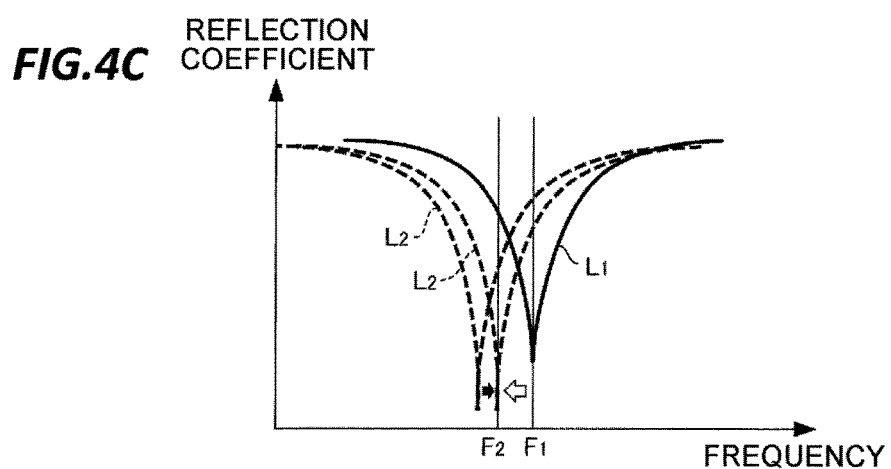

When the reflection minimum frequency $F_1$ is not able to be brought sufficiently close to the reflection minimum frequency $F_2$ even by the selection of the capacitor 20 having a proper capacity or the adjustment of the resistance value of the resistor 21, the reflection minimum frequency $F_2$ may be brought close to the reflection minimum frequency $F_1$ by changing the capacity of the variable capacitor 18 of the matcher 15 after the ignition of the plasma P to change the specific path capacity of the second route $L_2$ (see the black arrow in FIG. 4C). As a result, it is possible to cause the reflection minimum frequency $F_1$ and the reflection minimum frequency $F_2$ to fall into the frequency-variable range of the VF power supply 16.

Since the plasma processing method described above is able to reliably ignite the plasma P and also reliably maintain the plasma P, the plasma processing method is highly effective, in particular, in a processing condition where the plasma is difficult to be ignited due to a high internal pressure of the chamber 11 in the plasma processing or in a processing condition where a process gas which is difficult to ignite is used.

In the present exemplary embodiment described above, the reflection minimum frequency $F_1$ is brought close to the reflection minimum frequency $F_2$. As illustrated in FIG. 2, however, since both the reflection coefficients of the reflection minimum frequency $F_1$ and the reflection minimum frequency $F_2$ do not become zero (0), it is preferable that the VF power supply 16 has a high reflection resistance to allow the reflection of the high frequency current to some extent. It is also preferable that the VF power supply 16 generates the high frequency current more than a required amount of the high frequency current, in anticipation of the reflection of the high frequency current.

In addition, the auxiliary circuit 17 is not limited to the type illustrated in FIG. 1. The auxiliary circuit 17 may include a coil, and the stray capacity of the auxiliary circuit 17 itself may also serve as the capacitor. In addition, the wiring of the auxiliary circuit 17 may have a coil characteristic.

Next, a plasma processing apparatus according to a second exemplary embodiment of the present disclosure will be described.

The present exemplary embodiment is basically the same as the first exemplary embodiment described above in configurations and functional actions, but is different from the first exemplary embodiment described above in that the configuration of the auxiliary circuit is different from that of the first exemplary embodiment. Accordingly, descriptions on the redundant configurations and functional actions will be omitted and configurations and functional actions specific to the present exemplary embodiment will be described below.

Figure 5:
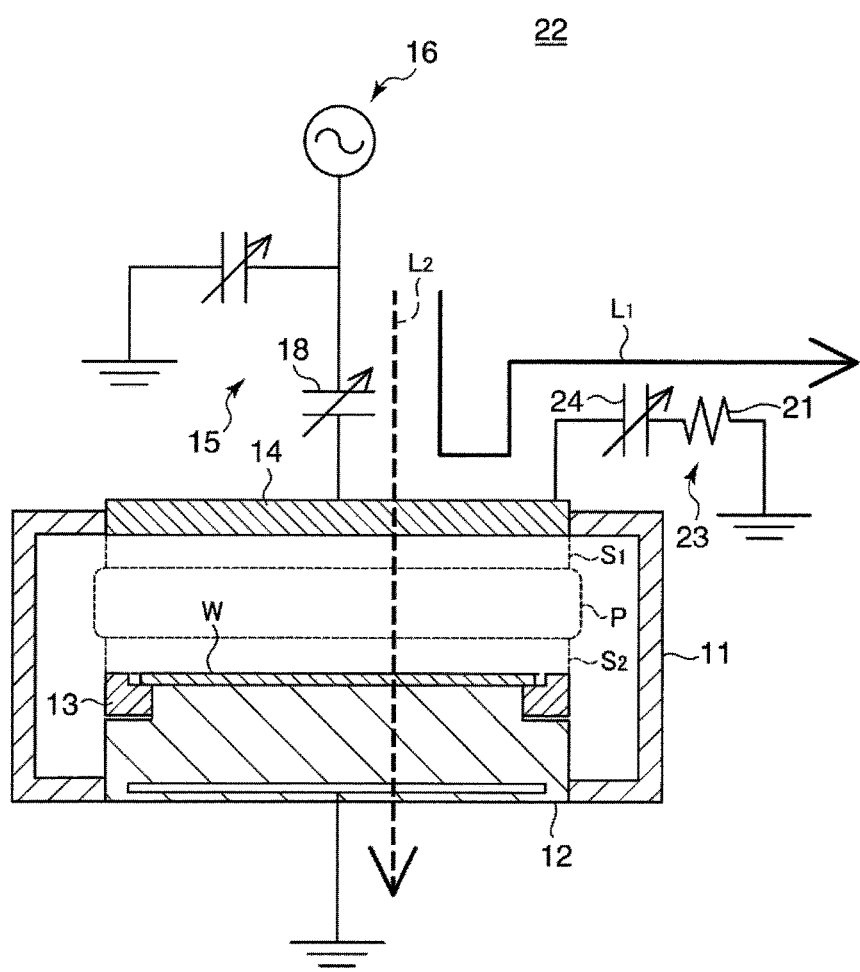
FIG. 5 is a cross-sectional view schematically illustrating a configuration of a plasma processing apparatus according to a second exemplary embodiment of the present disclosure.

FIG. 5 is a cross-sectional view schematically illustrating a configuration of a plasma processing apparatus according to the present exemplary embodiment.

Referring to FIG. 5, a plasma processing apparatus 22 is provided with an auxiliary circuit 23 which is connected to and grounds an upper electrode 14, in which the auxiliary circuit 23 includes a variable capacitor 24 and a resistor 21.

In the present exemplary embodiment, the path capacity of the auxiliary circuit 23 is also adjusted before the ignition of the plasma P to increase the specific path capacity of the first route $L_1$ and reduce the difference between the load impedance of the first route $L_1$ and the load impedance of the second route $L_2$. For example, either the capacity of the variable capacitor 24 or the resistance value of the resistor 12 of the auxiliary circuit 23 is adjusted so as to bring the reflection characteristic of the first route $L_1$ close to the reflection characteristic of the second route $L_2$. Thus, the reflection minimum frequency $F_1$ decreases to approach the reflection minimum frequency $F_2$. As a result, the VF power supply 16 may generate both a high frequency current having the reflection minimum frequency $F_1$ and a high frequency current having the reflection minimum frequency $F_2$ so that the plasma P may be reliably ignited and reliably maintained.

Next, a plasma processing method according to the present exemplary embodiment will be described.

Figure 6:
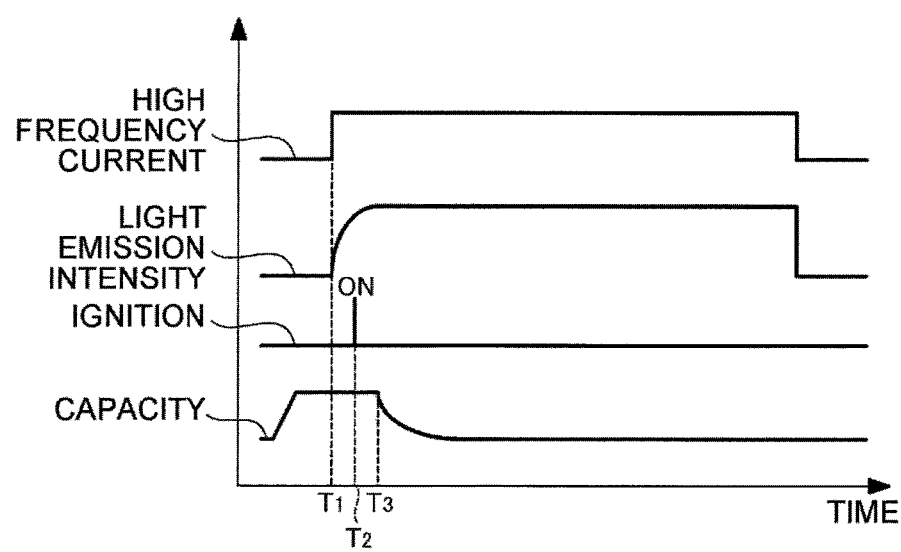
FIG. 6 is a view for describing a plasma processing method according to the present exemplary embodiment.

FIG. 6 is a view for describing the plasma processing method according to the present exemplary embodiment.

Referring to FIG. 6, first, before the ignition of plasma P, the capacity of the variable capacitor 24 of the auxiliary circuit 23 is increased to increase the specific path capacity of the first route $L_1$, and as illustrated in FIG. 2, the reflection characteristic of the first route $L_1$ is brought close to the reflection characteristic of the second route $L_2$ to reduce the reflection minimum frequency $F_1$, thereby bringing the first route $L_1$ close to the second route $L_2$.

Next, the VF power supply 16 is caused to generate a high frequency current having the reflection minimum frequency $F_1$ and a processing gas is introduced into the processing space ("$T_1$" in the graph). At this time, a large amount of high frequency current flows in the first route $L_1$ and the voltage across the upper electrode 14 increases so that an electric field is generated in the processing space.

Consequently, when the electric field is sufficiently developed, the processing gas is excited and the plasma P is ignited so that the light emission intensity of the plasma P in the processing space increases ("$T_2$" in the graph).

Next, after confirming the ignition of the plasma P, the capacity of the variable capacitor 24 of the auxiliary circuit 23 is reduced ("$T_3$" in the drawing) to change the frequency of the high frequency current generated from the VF power supply 16 from the reflection minimum frequency $F_1$ to the reflection minimum frequency $F_2$. At this time, the specific path capacity of the first route $L_1$ decreases and the reflection minimum frequency $F_1$ increases to be greatly spaced away from the reflection minimum frequency $F_2$. Thus, the high frequency current efficiently flows in the second route $L_2$ so that the plasma P is maintained in the processing space.

In the present exemplary embodiment, the auxiliary circuit 23 is not limited to the type illustrated in FIG. 5 but any type may be used as long as its capacity is variable. For example, the auxiliary circuit may include a variable resistor.

Meanwhile, in the present exemplary embodiment, the wiring of the auxiliary circuit 23 is not cut off even after the plasma P is ignited. Thus, in some cases, a very small amount of high frequency current may also flow in the first route $L_1$ and as a result, the distribution of the plasma P in the processing space may be somewhat disturbed. Thus, it is preferable that a plurality of auxiliary circuits 23 is symmetrically arranged with respect to the center of the upper electrode 14. Thus, since a plurality of first routes L1 in which a very small amount of high frequency current flows may be symmetrically arranged with respect to the center of the upper electrode 14, it is possible to suppress the distribution of the plasma P in the processing space from being disturbed.

Next, a plasma processing apparatus according to a third exemplary embodiment of the present disclosure will be described.

The present exemplary embodiment is basically the same as the first exemplary embodiment described above in configurations and functional actions, but is different from the first exemplary embodiment described above in that the auxiliary circuit is connected to the susceptor. Accordingly, the descriptions on the redundant configurations and functional actions will be omitted and configurations and functional actions specific to the present exemplary embodiment will be described below.

Figure 7:
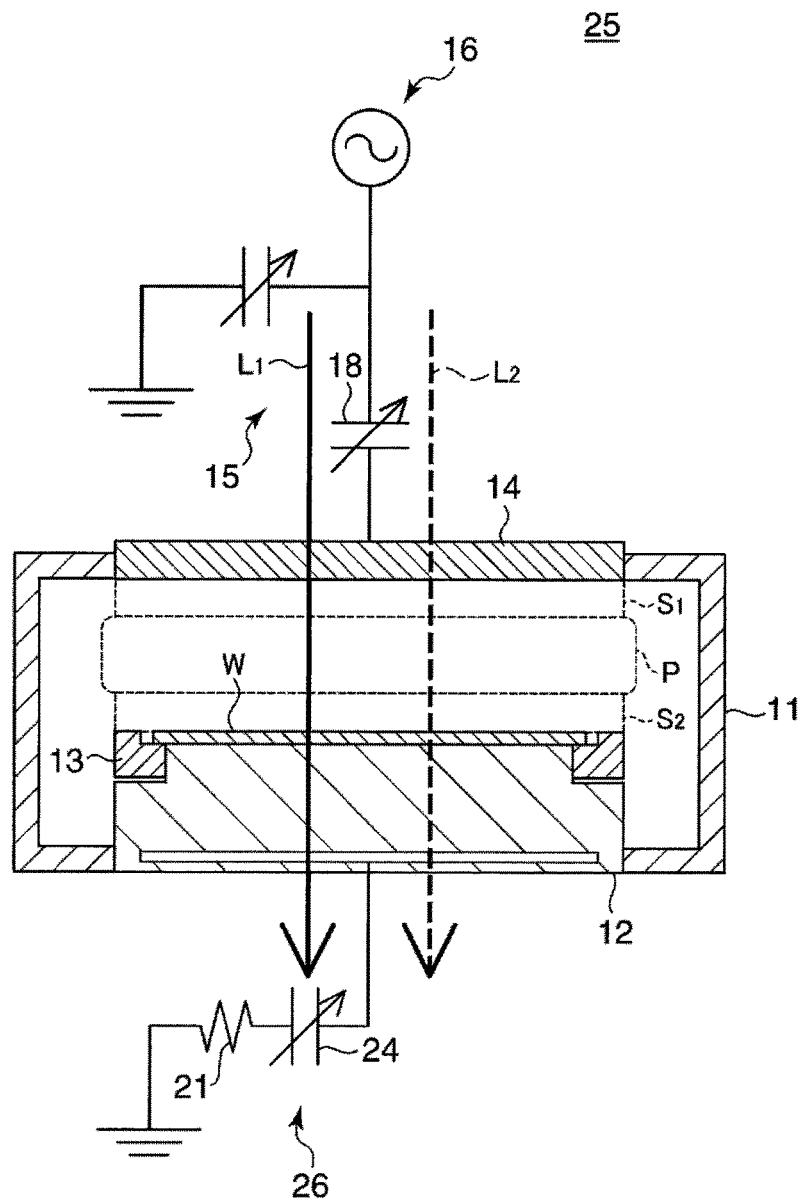
FIG. 7 is a cross-sectional view schematically illustrating a configuration of a plasma processing apparatus according to a third exemplary embodiment of the present disclosure.

FIG. 7 is a cross-sectional view schematically illustrating a configuration of the plasma processing apparatus according to the present exemplary embodiment.

Referring to FIG. 7, the plasma processing apparatus 25 is provided with an auxiliary circuit 26 which is connected to and grounds a susceptor 12, in which the auxiliary circuit 26 includes a variable capacitor 24 and a resistor 21.

In the plasma processing apparatus 25, the first route $L_1$ of the high frequency current before the ignition of plasma P (an arrow indicated by a solid line in FIG. 7) and the second route $L_2$ of the high frequency current after the ignition of the plasma P (an arrow indicated by a broken line in FIG. 7) are equal to each other. However, upon comparing the first route $L_1$ and the second route $L_2$ with each other, the second route $L_2$ is different from the first route $L_1$ in that a path capacity of the plasma P exists therein. Thus, the first route $L_1$ and the second route $L_2$ have different specific path capacities, respectively.

In order to handle this, the present exemplary embodiment adjusts the path capacity of the auxiliary circuit 26 before the ignition of the plasma P to reduce the difference between the reflection minimum frequency $F_1$ and the reflection minimum frequency $F_2$. Specifically, before the ignition of the plasma P, the capacity of the variable capacitor 24 of the auxiliary circuit 26 is increased to increase the specific path capacity of the first route $L_1$ so that the reflection characteristic of the first route $L_1$ is brought close to the reflection characteristic of the second route $L_2$. As a result, since the reflection minimum frequency $F_1$ decreases to approach the reflection minimum frequency $F_2$, the VF power supply 16 may generate both a high frequency current having the reflection minimum frequency $F_1$ and a high frequency current having the reflection minimum frequency $F_2$ so that the plasma P may be reliably ignited and reliably maintained.

After the ignition of the plasma P, the capacity of the variable capacitor 24 of the auxiliary circuit 26 decreases to reduce the specific path capacity of the first route $L_1$. Thus, the reflection minimum frequency $F_1$ increases to be greatly spaced away from the reflection minimum frequency $F_2$. As a result, the high frequency current efficiently flows in the second route $L_2$ so that the plasma P is maintained in the processing space.

Next, a plasma processing apparatus according to a fourth exemplary embodiment of the present disclosure will be described.

The present exemplary embodiment is basically the same as the first exemplary embodiment described above in configurations and functional actions, but is different from the first exemplary embodiment described above in that the auxiliary circuit is connected to a side wall of the chamber. Accordingly, descriptions on the redundant configurations and functional actions will be omitted and configurations and functional actions specific to the present exemplary embodiment will be described below.

Figure 8:
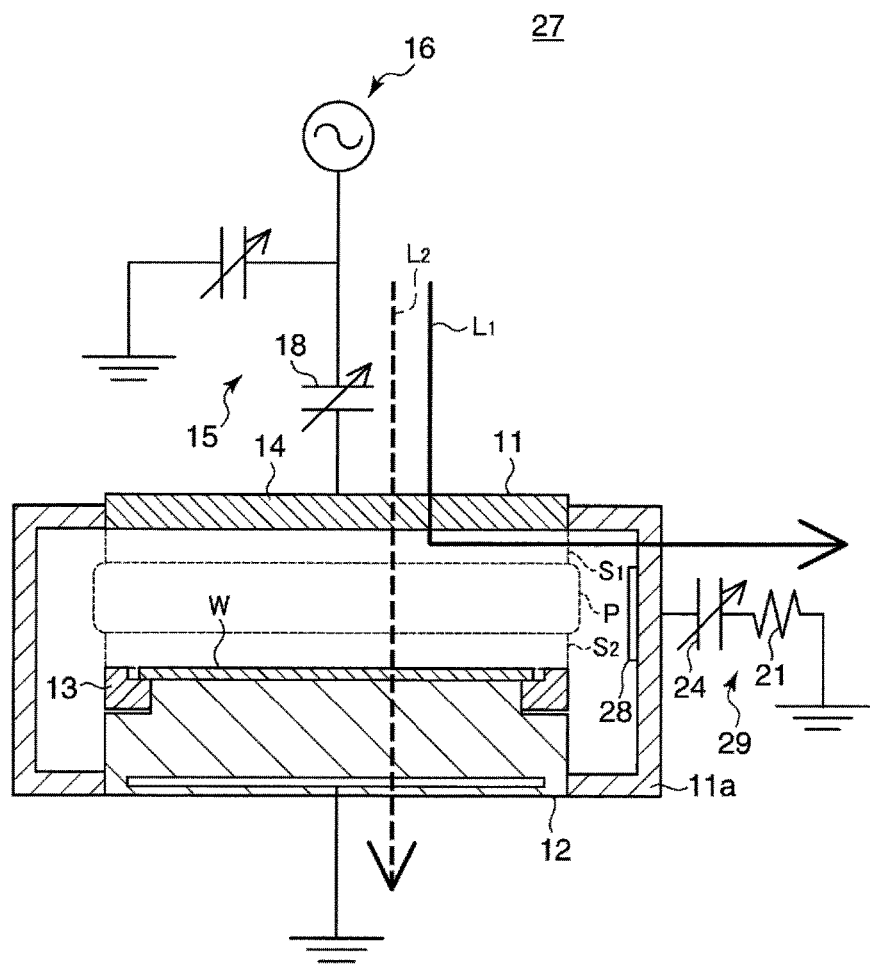
FIG. 8 is a cross-sectional view schematically illustrating a configuration of a plasma processing apparatus according to a fourth exemplary embodiment of the present disclosure.

FIG. 8 is a cross-sectional view schematically illustrating a configuration of the plasma processing apparatus according to the present exemplary embodiment.

Referring to FIG. 8, the plasma processing apparatus 27 is provided with a side wall electrode 28 (a third electrode) disposed on a side wall 11a of the chamber 11 to face plasma P and an auxiliary circuit 29 which is connected to and grounds the side wall electrode 28, in which the auxiliary circuit 29 includes a variable capacitor 24 and a resistor 21.

In the plasma processing apparatus 27, the first route $L_1$ of the high frequency current before the ignition of the plasma P (an arrow indicated by a solid line in FIG. 8) is grounded through the matcher 15, the side wall electrode 28, and the auxiliary circuit 29, and the second route $L_2$ of the high frequency current after the ignition of the plasma P (an arrow indicated by a broken line in FIG. 8) is grounded via the matcher 15, the sheath $S_1$, the plasma P, the sheath $S_2$, the wafer W, and the susceptor 12. That is, the first route $L_1$ and the second route $L_2$ are different from each other, and have different specific path capacities, respectively.

In the exemplary embodiment, the path capacity of the auxiliary circuit 29 is also adjusted before the ignition of the plasma P to reduce the difference between the reflection minimum frequency $F_1$ and the reflection minimum frequency $F_2$. Specifically, before the ignition of the plasma P, the capacity of the variable capacitor 24 of the auxiliary circuit 29 is increased to increase the specific path capacity of the first route $L_1$ so that the reflection characteristic of the first route $L_1$ is brought close to the reflection characteristic of the second route $L_2$. Thus, the VF power supply 16 is capable of generating both a high frequency current having the reflection minimum frequency $F_1$ and a high frequency current having the reflection minimum frequency $F_2$ so that the plasma P may be reliably ignited and reliably maintained.

After the ignition of the plasma P, the capacity of the variable capacitor 24 of the auxiliary circuit 29 is reduced to reduce the specific path capacity of the first route $L_1$ so that the reflection minimum frequency $F_1$ is greatly spaced away from the reflection minimum frequency $F_2$. As a result, the high frequency current efficiently flows in the second route $L_2$ so that the plasma P is maintained in the processing space.

In the present exemplary embodiment described above, after the ignition of the plasma P, the capacity of the variable capacitor 24 of the auxiliary circuit 29 is reduced. However, when the plasma P exists in the processing space, the side wall electrode 28 also serves as a counter electrode of the upper electrode 14 through the plasma P. Accordingly, when the capacity of the variable capacitor 24 is not reduced or finely reduced, the potential of the side wall electrode 28 may be adjusted (e.g., the potential of the side wall electrode 28 may be made to be equal to the potential of the susceptor 12), an anode/cathode ratio in the plasma processing apparatus 27 may be adjusted.

In addition, when the plasma P exists in the processing space, cations from the plasma P are implemented into the inner surface of the side wall 11a of the chamber 11 depending on the potential of the side wall electrode 28. Thus, when the capacity of the variable capacitor 24 is not reduced or finely reduced after the ignition of the plasma, the inner surface of the side wall 11a of the chamber 11 may be cleaned by removing, for example, deposits deposited on the inner surface by the sputtering of the cations.

Next, a plasma processing apparatus according to a fifth exemplary embodiment of the present disclosure will be described.

The present exemplary embodiment is basically the same as the first exemplary embodiment described above in configurations and functional actions, but is different from the first exemplary embodiment in that the VF power supply is connected to the susceptor and the auxiliary circuit is connected to the upper electrode. Accordingly, descriptions on the redundant configurations and functional actions will be omitted and configurations and functional actions specific to the present exemplary embodiment will be described below.

Figure 9:
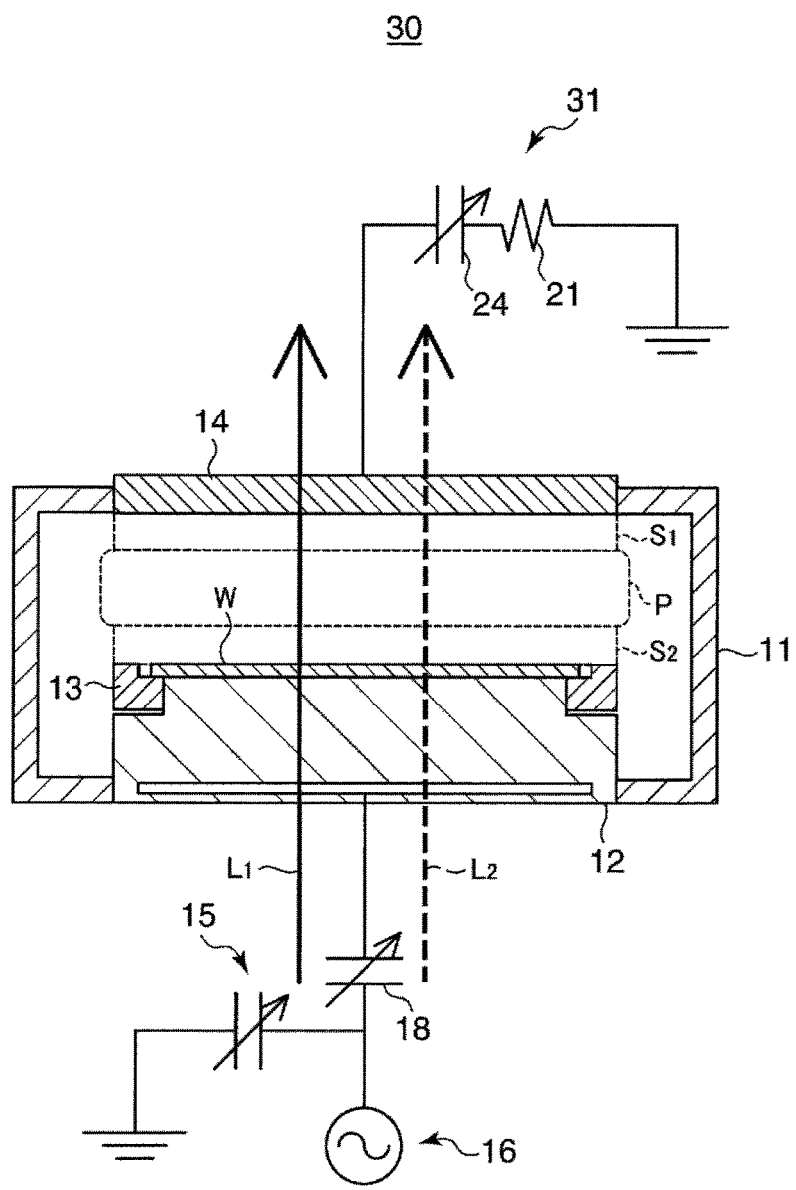
FIG. 9 is a cross-sectional view schematically illustrating a configuration of a plasma processing apparatus according to a fifth exemplary embodiment of the present disclosure.

FIG. 9 is a cross-sectional view schematically illustrating a configuration of a plasma processing apparatus according to the present exemplary embodiment.

Referring to FIG. 9, in a plasma processing apparatus 30, a VF power supply 16 is connected to the susceptor 12 via a matcher 15, and an auxiliary circuit 31 is connected to and grounds the upper electrode 14.

In the plasma processing apparatus 30, the first route $L_1$ of the high frequency current before the ignition of the plasma P (an arrow indicated by a solid line in FIG. 9) and the second route $L_2$ of the high frequency current after the ignition of the plasma P (an arrow indicated by a broken line in FIG. 9) are equal to each other. Upon comparing the first route $L_1$ and the second route $L_2$, the second route $L_2$ is different from the first route $L_1$ in that a path capacity of the plasma P exists therein as in the third exemplary embodiment. Therefore, the first route $L_1$ and the second route $L_2$ have different specific path capacities, respectively.

In order to handle this, the present exemplary embodiment also increases the capacity of the variable capacitor 24 of the auxiliary circuit 31 before the ignition of the plasma to bring the reflection minimum frequency $F_1$ close to the reflection minimum frequency $F_2$. As a result, the VF power supply 16 may generate both a high frequency current having the reflection minimum frequency $F_1$ and a high frequency current having the reflection minimum frequency $F_2$ so that the plasma P may be reliably ignited and reliably maintained.

In addition, after the ignition of the plasma P, the capacity of the variable capacitor 24 of the auxiliary circuit 31 is reduced so that the reflection minimum frequency $F_1$ is greatly spaced away from the reflection minimum frequency $F_2$. As a result, the high frequency current efficiently flows in the second route $L_2$ so that the plasma P is maintained in the processing space.

Next, a plasma processing apparatus according to a sixth exemplary embodiment of the present disclosure will be described.

The present exemplary embodiment is basically the same as the fourth exemplary embodiment described above in configurations and functional actions, but different from the fourth exemplary embodiment of the present disclosure in that the electrode disposed on the side wall of the chamber is directly grounded and the auxiliary circuit is connected to the susceptor. Accordingly, descriptions on the redundant configurations and functional actions will be omitted and configurations and functional actions specific to the present exemplary embodiment will be described.

Figure 12:
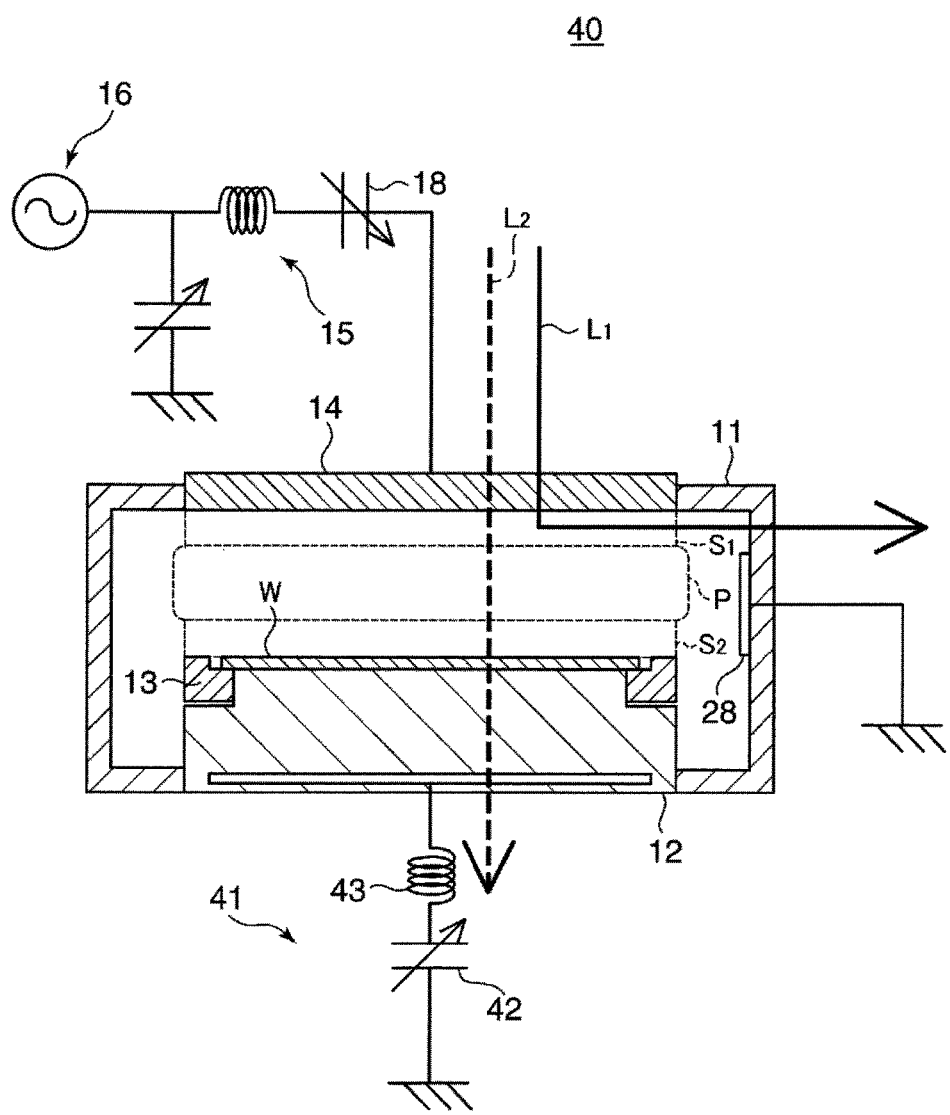
FIG. 12 is a cross-sectional view schematically illustrating a configuration of a plasma processing apparatus according to a sixth exemplary embodiment of the present disclosure.

FIG. 12 is a cross-sectional view schematically illustrating a configuration of a plasma processing apparatus according to the present exemplary embodiment.

Referring to FIG. 12, in a plasma processing apparatus 40, a side wall electrode 28 is directly grounded, and a susceptor 12 is grounded via an auxiliary circuit 41. The auxiliary circuit 41 includes a variable capacitor 42 and a coil 43.

In the plasma processing apparatus 40, the second route $L_2$ of the high frequency current before the ignition of the plasma P (the arrow indicated by a broken line in FIG. 12) is grounded via a matcher 15, a sheath $S_1$, plasma P, a sheath $S_2$, a wafer W, and the susceptor 12, and the first route $L_1$ of the high frequency current after the ignition of the plasma P (an arrow indicated by a solid line in FIG. 12) is grounded via the matcher 15 and the side wall electrode 28. That is, the first route $L_1$ and the second route $L_2$ are different from each other, and the first route $L_1$ and the second route $L_2$ have different specific path capacities, respectively.

Thus, the present exemplary embodiment also adjusts the path capacity of the auxiliary circuit 41 before the ignition of the plasma P to reduce the difference between the reflection minimum frequency $F_1$ and the reflection minimum frequency $F_2$. Specifically, the capacity of the variable capacitor 42 of the auxiliary circuit 41 is changed and the specific path capacity of the second route $L_2$ is changed so that the reflection characteristic of the second route $L_2$ is brought close to the reflection characteristic of the first route $L_1$. As a result, the VF power supply 16 may generate both a high frequency current having the reflection minimum frequency $F_1$ and a high frequency current having the reflection minimum frequency $F_2$.

In the plasma processing apparatus 40, the high frequency current having the reflection minimum frequency $F_2$ is generated from the VF power supply 16 before the ignition of the plasma P so that the high frequency current may efficiently flow in the second route $L_2$ and thus the plasma may be efficiently ignited in the processing space.

After the ignition of the plasma P, the high frequency current having the reflection minimum frequency $F_1$ is generated from the VF power supply 16 so that the high frequency current may efficiently flow in the first route $L_1$ and excessive generation of the plasma P in the processing space or increase of the potential of the wafer W may be suppressed. Thus, the wafer W may be suppressed from being damaged by the etching by the excessive plasma P.

In addition, after the ignition of the plasma P, the capacity of the variable capacitor 42 of the auxiliary circuit 41 may be changed so that the specific path capacity of the second route $L_2$ may be brought close to the specific path capacity of the first route $L_1$ and thus, the reflection minimum frequency $F_2$ may be brought close to the reflection minimum frequency $F_1$.

For example, when, before the ignition of the plasma P, the high frequency current efficiently flows in the second route $L_2$ and after the ignition of the plasma P, the capacity of the variable capacitor 42 of the auxiliary circuit 41 is changed to bring the reflection minimum frequency $F_2$ close to the reflection minimum frequency $F_1$, the high frequency current may flow in the first route $L_1$ as well as in the second route $L_2$. As a result, the generation of the plasma P in the processing space may be reliably maintained. In addition, during the plasma processing of the wafer W by the plasma P, the reflection minimum frequency $F_2$ may be brought close to the reflection minimum frequency $F_1$ by changing the capacity of the variable capacitor 42 of the auxiliary circuit 41. As a result, since the density or distribution of the plasma P may be changed by changing the route of the power (high frequency current) in the processing space, it is possible to solve a problem of unevenness of a plasma processing during the plasma processing of a wafer W or inclination of a via or a trench in etching.

In addition, similarly to the fourth exemplary embodiment, before the ignition of the plasma P, the high frequency current having the reflection minimum frequency $F_1$ may be generated from the VF power supply 16 so that the high frequency current may efficiently flow in the first route $L_1$ and after the ignition of the plasma P, the high frequency current having the reflection minimum frequency $F_2$ may be generated from the VF power supply 16 so that the high frequency current may efficiently flow in the second route $L_2$. As a result, when the plasma P is ignited, a large amount of high frequency current flows in the second route $L_2$ so that, for example, a component existing in the second route $L_2$ may be prevented from being electrically destroyed and after the ignition of the plasma, the flame-out of the plasma P in the processing space may be prevented.

In addition, during the plasma processing of the wafer W by the plasma P, the frequency of the high frequency current generated from the VF power supply 16 may be changed between the reflection minimum frequency $F_1$ and the reflection minimum frequency $F_2$. Since this may also change the route of the power (high frequency current) in the processing space to change the density or distribution of the plasma P, it is possible to solve a problem of unevenness of a plasma processing during the plasma processing of a wafer W or inclination of a via or a trench in etching.

Meanwhile, the selection order of the first route $L_1$ and the second route $L_2$ may be changed according to a characteristic of the chamber 11 or a required wafer processing characteristic.

In the foregoing, the present disclosure has been described with reference to respective exemplary embodiments but is not limited thereto.

In addition, the objects of the present disclosure may also be achieved when a storage medium storing program codes of software is supplied to, for example, a computer (not illustrated), and a CPU of the computer reads out and executes the program codes stored in the storage medium.

In this case, the program codes themselves, read out from the storage medium, may execute the functions of the respective exemplary embodiments as described above, and the program codes and the storage medium storing the program codes constitute the present disclosure.

Any medium may be used as the storage medium for supplying the program codes as long as it is able to store the program codes, and may include, for example, an RAM, an NV-RAM, a floppy disk (registered trademark), a hard disk, a magneto-optical disk, an optical disk such as, for example, a CD-ROM, a CD-R, a CD-RW, or a DVD (DVD-ROM, DVD-RAM, DVD-RW, DVD+RW), a magnetic tape, a volatile memory card, and other ROMs. Alternatively, the program codes may be supplied to the computer by being downloaded from, for example, another computer or database (not illustrated) connected to, for example, the internet, a commercial network, or a local area network (LAN).

The functions of respective exemplary embodiments described above may be achieved by executing the program codes read out by the computer. Further, based on the instruction of the program codes, for example, an operating system (OS) driven in the CPU may perform some or all of actual processings, and then the functions of the exemplary embodiments described above may be achieved by the processings.

The program codes read out from the storage medium may be stored in a memory provided in a function expansion board inserted in the computer or a function expansion unit connected to the computer. Then, based on the instruction of the program codes, for example, a CPU provided in the function expansion board or the function expansion unit may perform some or all of actual processings, and the functions of the exemplary embodiments described above may be achieved by the processings.

The program codes may be constituted by object codes, program codes executable by an interpreter, or script data to be supplied to an OS.

Next, influences of the capacity of an auxiliary circuit on a reflection characteristic of a route of a high frequency current will be described.

Figure 10A:
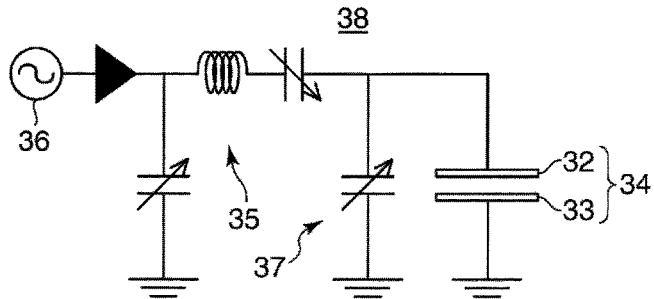
Figure 10B:
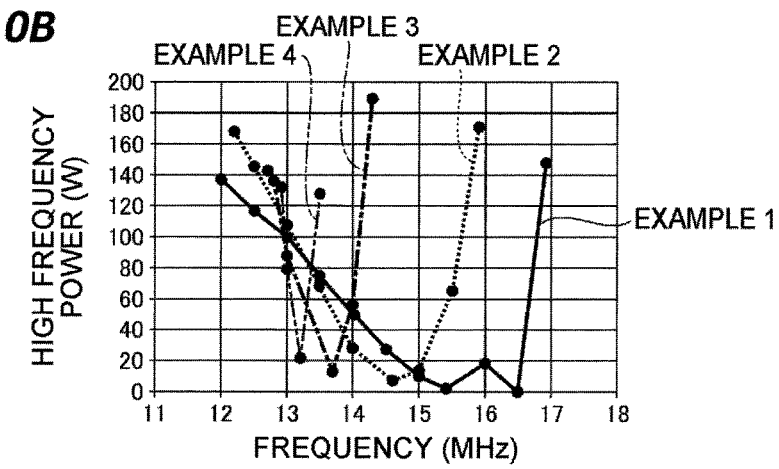
Figure 10C:
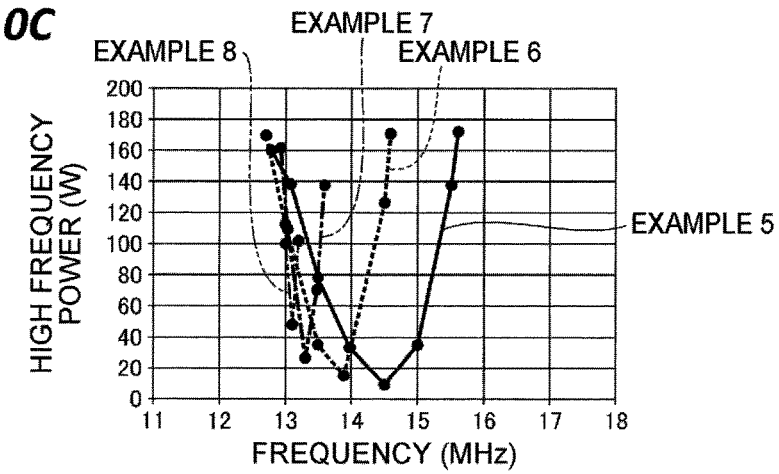
Figure 11:
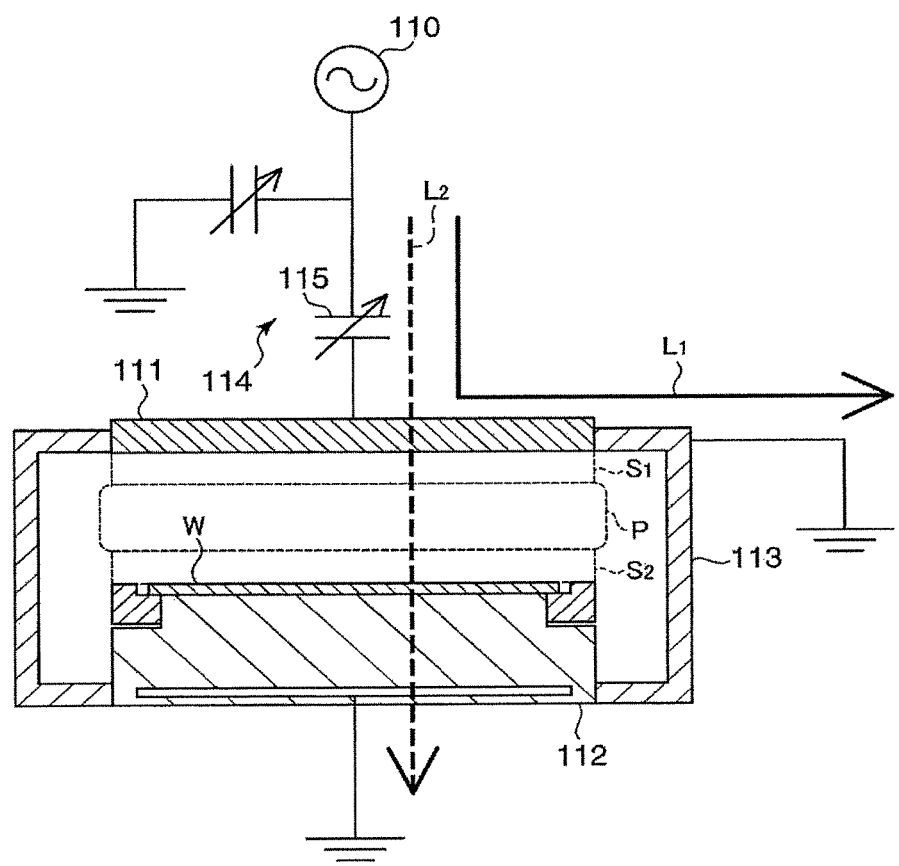
FIG. 11 is a cross-sectional view illustrating a configuration of a conventional plasma processing apparatus.

FIGS. 10A to 10C are views for describing influences of the capacity of an auxiliary circuit on a reflection characteristic of a high frequency current, in which FIG. 10A is a wiring diagram schematically illustrating a circuit of a plasma processing apparatus used by the inventors in a test for confirming the influences, FIG. 10B is a graph illustrating reflection characteristics in a case where the internal pressure of the processing space is 800 mTorr and the processing gas is formed of a mixed gas of argon gas and oxygen gas, and FIG. 10C is a graph illustrating reflection characteristics in a case where the internal pressure of the processing space is 800 mTorr and the processing gas is formed of a single gas of nitrogen gas. In the graphs of FIGS. 10B and 10C, the vertical axes represent a high frequency power required for igniting plasma. Since a reflection coefficient of a high frequency current is proportional to a high frequency power required for igniting plasma, the vertical axes in the graphs of FIGS. 10B and 10C correspond to a reflection coefficient of a high frequency current.

First, the inventors prepared a plasma processing apparatus 38 including a pair of parallel electrodes 34 formed by an upper electrode 32 and a lower electrode 33 disposed within a chamber, a VF power supply 36 connected to the upper electrode 32 via a matcher 35, and an auxiliary circuit 37 branched between the VF power supply 36 and the upper electrode 32 and grounded. Meanwhile, in the plasma processing apparatus 38, the processing space between the upper electrode 32 and the lower electrode 33 was decompressed and a processing gas was introduced into the processing space between the upper electrode 32 and the lower electrode 33. The auxiliary circuit 37 included a variable capacitor 39 in which the route of the high frequency current before the ignition of the plasma (hereinafter, referred to as a "pre-ignition route") was grounded via the matcher 35 and the auxiliary circuit 37, and the route of the high frequency current after the ignition of the plasma (hereinafter, referred to as a "post-ignition route") was grounded via the matcher 35 and the parallel electrodes 34.

Subsequently, the processing space between the upper electrode 32 and the lower electrode 33 was decompressed to 800 mTorr, a processing gas formed of a mixed gas of argon gas and oxygen gas with a flow rate ratio of 400 sccm/40 sccm was introduced into the processing space, and a high frequency power was supplied to the parallel electrodes 34 from the VF power supply 36. At this time, the capacity of the variable capacitor 39 of the auxiliary circuit 37 was changed and the frequency of the high frequency power supplied from the VF power supply 36 was also changed to measure the high frequency power required for igniting plasma in the processing space. The measured results are represented on the graph of FIG. 10B. That is, the reflection characteristics before the ignition of plasma are represented on the graph of FIG. 10B. Although not represented, reflection minimum frequencies of the pre-ignition route and reflection minimum frequencies of the post-ignition route were measured and differences therebetween (hereinafter, referred to as "differences in reflection minimum frequency before and after ignition") were also recorded.

Here, a case where the capacity of the variable capacitor 39 was 109 pF is referred to as Example 1, a case where the capacity was 148 pF is referred to as Example 2, a case where the capacity was 226 pF is referred to as Example 3, and a case where the capacity was 304 pF is referred to as Example 4.

The differences in reflection minimum frequency before and after ignition were 2.4 MHz in Example 1, 1.6 MHz in Example 2, 0.7 MHz in Example 3, and 0.2 MHz in Example 4, respectively. As a result, it is found that as the capacity of the auxiliary circuit 37 increases, the differences in reflection minimum frequency before and after ignition decrease. That is, it is found that when the capacity of the auxiliary circuit 37 increases, the reflection characteristic of the route of the high frequency current before the ignition of the plasma approaches the reflection characteristic of the route of the high frequency current after the ignition of the plasma and thus, both the reflection minimum frequency of the pre-ignition route and the reflection minimum frequency of the post-ignition route become more likely to be included in the frequency-variable range of the VF power supply 36.

In addition, from the graph of FIG. 10B, when the capacity of the auxiliary circuit 37 decreases, the frequency range of the high frequency power capable of igniting the plasma increases but the reflection minimum frequency of the pre-ignition route increases. In other words, when the capacity of the auxiliary circuit 37 decreases, the plasma may be easily ignited but a high frequency power having a relatively high frequency is required.

Next, the processing space between the upper electrode 32 and the lower electrode 33 was decompressed to 800 mTorr, a processing gas formed of a single gas of nitrogen gas with a flow rate of 400 sccm was introduced into the processing space, and a high frequency power was supplied to the parallel electrodes 34 from the VF power supply 36. At this time, the capacity of the variable capacitor 39 of the auxiliary circuit 37 was also changed and the frequency of the high frequency power supplied from the VF power supply 36 was also changed to measure the high frequency power required when the plasma is ignited in the processing space. The measured results are represented on the graph of FIG. 10C. In addition, although not represented, the reflection minimum frequencies of the pre-ignition route and the reflection minimum frequencies of the post-ignition route were measured and the differences in reflection minimum frequency before and after the ignition were also recorded.

Here, a case where the capacity of the variable capacitor 39 was 109 pF is referred to as Example 5, a case where the capacity was 148 pF is referred to as Example 6, a case where the capacity was 226 pF is referred to as Example 7, and a case where the capacity was 304 pF is referred to as Example 8.

The differences in reflection minimum frequency before and after ignition were 1.5 MHz in Example 5, 0.9 MHz in Example 6, 0.3 MHz in Example 7, and 0.1 MHz in Example 8, respectively. From this, it is found that when the capacity of the auxiliary circuit 37 increases, the reflection characteristic of the route of the high frequency current before the ignition of plasma approaches the reflection characteristic of the route of the high frequency current after the ignition of plasma, and both the reflection minimum frequency of the pre-ignition route and the reflection minimum frequency of the post-ignition route become more likely to be included in the frequency-variable range of the VF power supply 36.

In addition, from the graph of FIG. 10C, it is also found that when the capacity of the auxiliary circuit 37 decreases, the frequency range of the high frequency power capable of igniting plasma increases but the reflection minimum frequency of the pre-ignition route increases.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing method comprising:
providing a first electrode connected with a high frequency power supply and a second electrode disposed to face the first electrode;
providing a load impedance adjusting circuit including a switch and a capacitor connected between the first electrode and a ground thereby forming a first route from the high frequency power supply to the ground via the first electrode and the load impedance adjusting circuit;
activating the first route by turning ON the switch of the load impedance adjusting circuit thereby allowing a high frequency current from the high frequency power supply to flow through the first route to the ground before plasma is ignited;
igniting the plasma between the first electrode and the second electrode while the switch is ON; and
after the plasma is ignited, turning OFF the switch of the load impedance adjusting circuit thereby de-activating the first route while the plasma exists between the first electrode and the second electrode, wherein a second route extends from the high frequency power supply to the ground via the first electrode, the plasma, and the second electrode, and wherein turning OFF of the switch to the load impedance adjusting circuit thereby increases the high frequency current flow through the second route from the high frequency power supply to the ground to maintain the plasma on a substrate disposed on the second electrode.

2. The plasma processing method of claim 1, wherein the load impedance adjusting circuit reduces a difference between a reflection minimum frequency of the first route and a reflection minimum frequency of the second route.

3. The plasma processing method of claim 2, wherein the high frequency power supply is a frequency-variable power supply and a frequency range to be changed by the frequency-variable power supply includes the reflection minimum frequency of the first route and the reflection minimum frequency of the second route.

4. The plasma processing method of claim 3, wherein the difference between the reflection minimum frequency of the first route and the reflection minimum frequency of the second route is within 2 MHz.

5. The plasma processing method of claim 2, wherein the load impedance adjusting circuit is separated from the first route after the ignition of the plasma.

6. The plasma processing method of claim 2, wherein a capacity of the load impedance adjusting circuit is adjusted after the ignition of the plasma.

7. The plasma processing method of claim 2, wherein a matching circuit configured to change a capacity is disposed between the high frequency power supply and the first electrode, and the matching circuit adjusts the difference between the reflection minimum frequency of the first route and the reflection minimum frequency of the second route.

8. The plasma processing method of claim 1, wherein the load impedance adjusting circuit adjusts a capacity thereof to reduce the difference between a load impedance from the high frequency power supply to the ground before ignition of the plasma and a load impedance from the high frequency power supply to the ground after the ignition of the plasma.

9. The plasma processing method of claim 1, wherein after igniting the plasma and prior to turning OFF the switch of the load impedance adjusting circuit, the high frequency current flows through both the first route and the second route, and wherein after turning OFF the switch to the load impedance adjusting circuit, high frequency current flow through the first route is decreased while high frequency current flow through the second route is increased.

\* \* \* \* \*